United States Patent
Li et al.

(10) Patent No.: US 10,295,583 B2
(45) Date of Patent: May 21, 2019

(54) CIRCUIT FOR MEASURING FLICKER NOISE AND METHOD OF USING THE SAME

(71) Applicant: TAIWAN SEMICONDUCTOR MANUFACTURING COMPANY, LTD., Hsinchu (TW)

(72) Inventors: Chao Chieh Li, Hsinchu (TW); Ruey-Bin Sheen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/688,336

(22) Filed: Apr. 16, 2015

(65) Prior Publication Data
US 2016/0305999 A1 Oct. 20, 2016

(51) Int. Cl.
  *H03M 1/08* (2006.01)
  *H03M 1/10* (2006.01)
  *G01R 29/26* (2006.01)

(52) U.S. Cl.
  CPC .............. *G01R 29/26* (2013.01); *H03M 1/08* (2013.01); *H03M 1/109* (2013.01)

(58) Field of Classification Search
  CPC .............................. H03K 3/0322; G01R 29/26
  See application file for complete search history.

(56) References Cited

U.S. PATENT DOCUMENTS 5,374,860 A * 12/1994 Llewellyn .............. H03K 5/131
  327/261
5,861,780 A * 1/1999 Fukuda ................ H03K 3/0315
  331/179
(Continued)

FOREIGN PATENT DOCUMENTS

CN  1782987  6/2006
CN  102007470  4/2011
(Continued)

OTHER PUBLICATIONS

Hajimiri et al. (Hajimiri, A. "Jitter and Phase Noise in Ring Oscillators." IEEE Journal of Solid-State Circuits vol. 34, No. 6 (1999): pp. 790-804.*

(Continued)

*Primary Examiner* — Noam Reisner
(74) *Attorney, Agent, or Firm* — Hauptman Ham, LLP

(57) ABSTRACT

A flicker noise measurement circuit includes a first section. The first section includes a plurality of first stages connected in series. The first section includes a first feedback switching element configured to selectively feedback an output of the plurality of first stages to an input of the plurality of first stages. The first section includes a first section connection switching element. The flicker noise measurement circuit includes a second section connected to the first section. The second section includes a plurality of second stages connected in series, wherein the first section connection switching element is configured to selectively connect the plurality of second stages to the plurality of first stages. The second section includes a second feedback switching element configured to selectively feedback an output of the plurality of second stages to the input of the plurality of first stages.

20 Claims, 6 Drawing Sheets

(56) References Cited

U.S. PATENT DOCUMENTS

| | | | |
|---|---|---|---|
| 6,310,928 B1 | 10/2001 | Yunome | |
| 6,763,079 B1* | 7/2004 | Iwamoto | G01R 31/31725 327/156 |
| 7,797,361 B2 | 9/2010 | Lazich et al. | |
| 8,279,008 B2 | 10/2012 | Hsieh et al. | |
| 8,427,240 B2 | 4/2013 | Hsieh et al. | |
| 8,531,247 B2 | 9/2013 | Dichtl | |
| 8,593,206 B2 | 11/2013 | Chen et al. | |
| 8,610,494 B1 | 12/2013 | Jin et al. | |
| 8,618,631 B2 | 12/2013 | Jin et al. | |
| 2007/0182493 A1* | 8/2007 | Sai | H03L 7/0995 331/2 |
| 2010/0127714 A1* | 5/2010 | Negishi | G01R 29/26 324/613 |
| 2010/0148751 A1* | 6/2010 | Okayasu | G01R 29/26 324/76.52 |
| 2010/0327982 A1* | 12/2010 | Dixit | H03K 3/02 331/44 |
| 2011/0121906 A1 | 5/2011 | Dixit et al. | |
| 2012/0092230 A1 | 4/2012 | Hung et al. | |
| 2012/0299608 A1* | 11/2012 | Liu | G01R 31/2642 324/750.03 |
| 2013/0049810 A1 | 2/2013 | Lu et al. | |
| 2013/0234305 A1 | 9/2013 | Lin et al. | |
| 2014/0132333 A1 | 5/2014 | Jin et al. | |
| 2014/0217546 A1 | 8/2014 | Yen et al. | |
| 2014/0253262 A1 | 9/2014 | Hsieh et al. | |
| 2014/0253391 A1 | 9/2014 | Yen | |

FOREIGN PATENT DOCUMENTS

| | | |
|---|---|---|
| JP | 2001-094419 | 4/2001 |
| JP | 2007-208773 | 8/2007 |

OTHER PUBLICATIONS

Office Action dated Sep. 22, 2016 and English translation from corresponding application No. KR 10-2015-0163422.

Office Action dated Jun. 25, 2018 from corresponding application No. CN 201510565931.0.

Ali Hajimiri et al., "Jitter and Phase Noise in Ring Oscillators", IEEE Journal of Solid-State Circuits, vol. 34, No. 6, Jun. 1999; pp. 790-804.

Office Action dated Jan. 28, 2019 from corresponding application No. CN 201510565931.0.

* cited by examiner

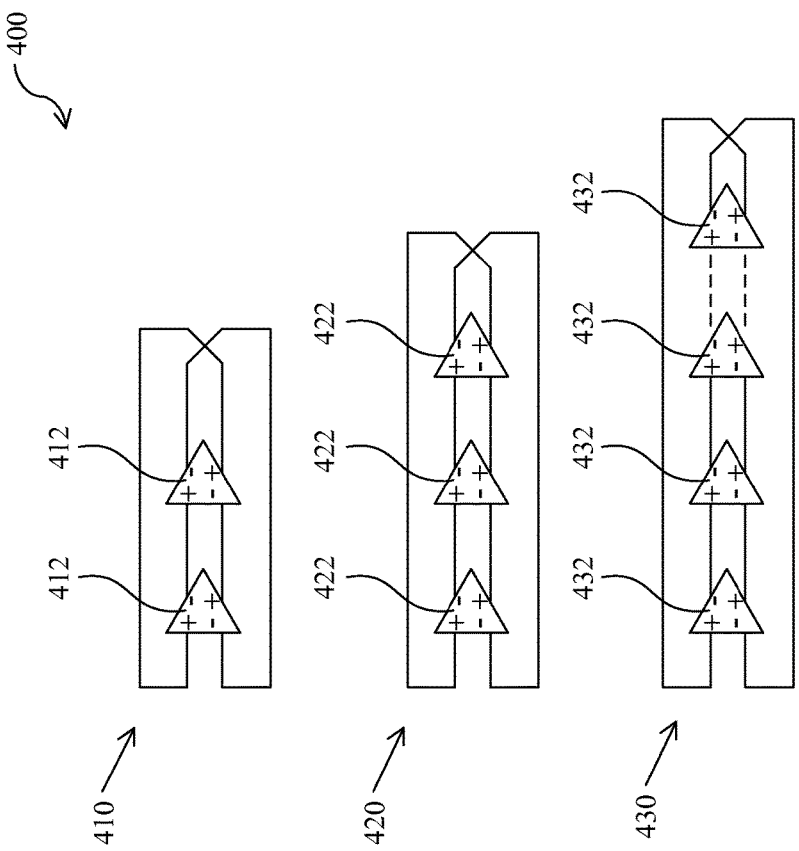

CIRCUIT FOR MEASURING FLICKER NOISE AND METHOD OF USING THE SAME

BACKGROUND

Flicker noise is a type of electronic noise present in electronic devices operating using direct current (DC). Flicker noise is a result of impurities in a channel of a device or variations in charge generation or elimination in a device, in some instances. Flicker noise is a change in resistance of the device and manifests as a change in voltage or current based on Ohm's Law.

Electronic noise impacts reliability of a device because as an amount of noise increases, accurately determining an output of the device becomes more difficult. In high-frequency devices, flicker noise contributes a minor portion of an overall noise of the device because an amount of white noise dominates the amount of flicker noise. In low-frequency devices, the overall noise is reduced to a noise inherent in the device, i.e., phase noise. In a transition area between high-frequency devices and low-frequency devices, flicker noise is determined as being a significant factor in determining the overall noise of the device. As technology nodes shrink, a frequency of the transition area for overall noise of a device increases.

In some instances, the flicker noise is measured using external equipment. In some instances, the flicker noise is extrapolated based on simulated noise as an operating frequency of a device is altered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a schematic diagram of a flicker noise measurement circuit for measuring flicker noise in accordance with some embodiments.

DETAILED DESCRIPTION

Figure 1:
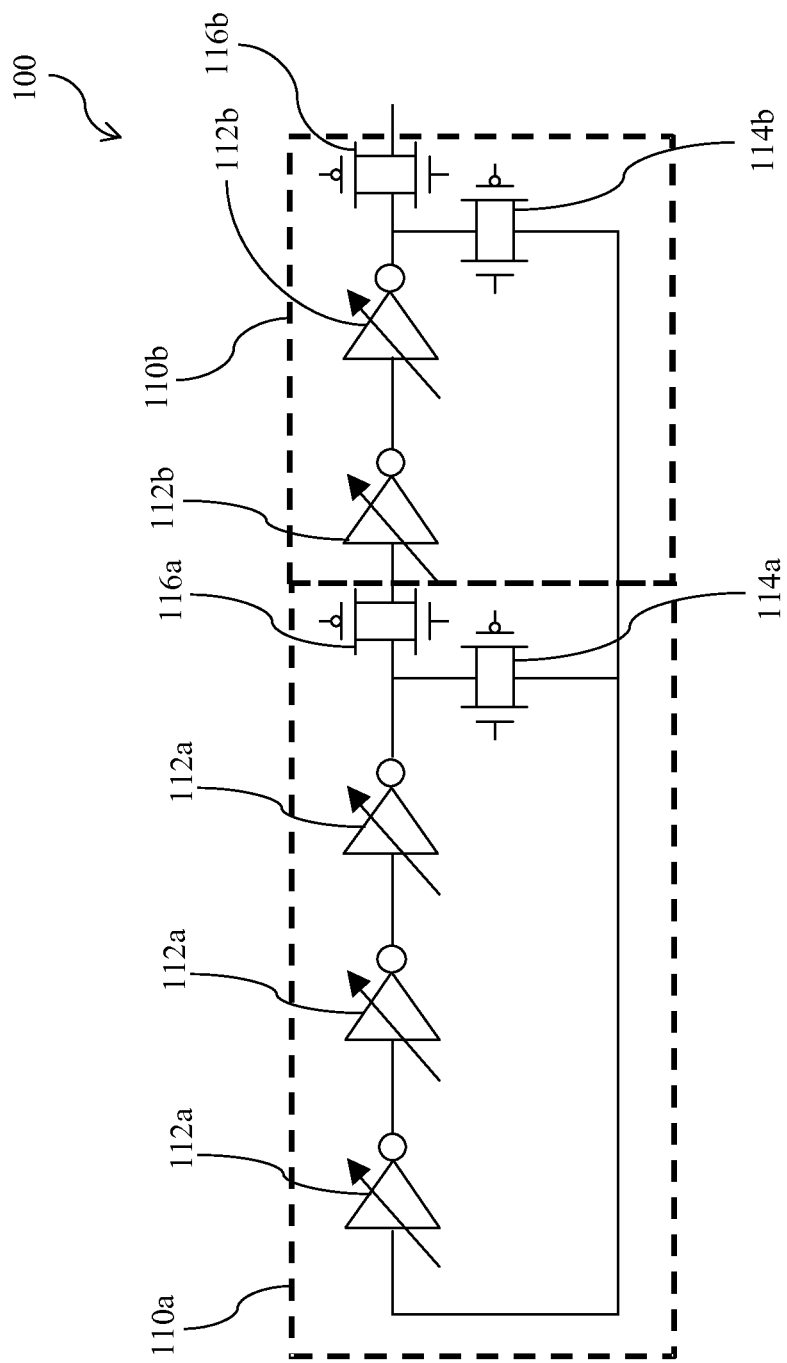
FIG. 1 is a schematic diagram of a flicker noise measurement circuit for measuring flicker noise in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Flicker noise contributes significantly to device performance in devices such as phase locked loops (PLLs), analog-to-digital converters (ADCs), and digital-to-analog converters (DACs). Accurate determination of flicker noise for smaller technology nodes helps with accurate determination of performance of devices manufactured using the smaller technology nodes. As technology nodes shrink, a frequency at which flicker noise is a significant factor in a total noise of a device increases. For example, at a node size of about N28 the frequency at which flicker noise is a significant factor is several hundred megahertz (MHz); however, as a node size decreases to about N10 the frequency at which flicker noise is a significant factor is several gigahertz (GHz).

In some instances, the flicker noise is measured using external equipment. Such external equipment is often very expensive. In some instances, the flicker noise is extrapolated based on simulation results or measurements performed on manufactured devices. However, such extrapolations often include a considerable error factor. In some instances, the extrapolated flicker noise has an error factor of ten times or more.

A simplified and accurate manner of calculating flicker noise in a device is possible by measuring an output waveform of a flicker noise measurement circuit within the device and measuring phase noise in the device. The flicker noise is then able to be determined based on the phase noise, a number of stages in the flicker noise measurement circuit, and a ratio of a slope of a rise of the output waveform to a slope of the fall of the output waveform.

Using a flicker noise measurement circuit as part of the device along with calculations based on the phase noise, a number of stages in the flicker noise measurement circuit, and a ratio of a slope of a rise of the output waveform to a slope of the fall of the output waveform provides an inexpensive and accurate way to determine flicker noise of the device.

FIG. 1 is a schematic diagram of a flicker noise measurement circuit 100 for measuring flicker noise in accordance with some embodiments. Flicker noise measurement circuit 100 includes a first section 110a selectively connected to a second section 110b. First section 110a includes a plurality of variable inverters 112a connected in series. Each variable inverter of variable inverters 112a is considered a stage. A feedback transmission gate 114a is configured to selectively connect an output of inverters 112a back to an input of the inverters. A section connection transmission gate 116a is configured to selectively connect first section 110a to second section 110b. Second section 110b includes a plurality of variable inverters 112b connected in series. Each variable inverter of variable inverters 112b is considered a stage. A feedback transmission gate 114b is configured to selectively connect an output of inverters 112b back to the input of variable inverters 112a. A section connection transmission gate 116b is configured to selectively connect second section 110b to subsequent sections of flicker noise measurement circuit 100.

Flicker noise measurement circuit 100 includes two sections 110a and 110b. Each section 110a and 110b independently is a ring oscillator. In some embodiments, flicker noise measurement circuit 100 includes more than two sections. In some embodiments, first section 110a includes an odd number of stages, e.g., variable inverters 112a, and every other section of flicker noise measurement circuit 100, e.g., second section 110b, includes an even number of stages, e.g., variable inverters 112b. In some embodiments, a number of stages in flicker noise measurement circuit is five stages, seven stages, nine stages, or 2X+1 stages, where X is an integer greater than or equal to 1.

First section 110a includes three variable inverters 112a. In some embodiments, first section 110a includes more or less than three variable inverters 112a. In some embodiments, first section 110a includes one variable inverter, five variable inverters, or seven variable inverters. Each variable inverter 112a has a same structure. In some embodiments, at least one variable inverter 112a has a different structure from at least one other variable inverter 112a.

First section 110a also includes feedback transmission gate 114a to selectively feedback the output of the first section to an input of the first section. In some embodiments, feedback transmission gate 114a is configured to be controlled by an external circuit. In some embodiments, the external circuit includes a control circuit integrated into a same device as flicker noise measurement circuit 100, a testing circuit of a separate device from the flicker noise measurement circuit, or another suitable controlling circuit. In a measuring arrangement where first section 110a is disconnected from second section 110b, e.g., section connection transmission gate 116a is de-activated; feedback transmission gate 114a is activated to connect the output of variable transistors 112a to the input of the variable transistors. In some embodiments, feedback transmission gate 114a is replaced by a different switching element. In some embodiments, feedback transmission gate 114 is replaced by a transistor, a logic gate, a thyristor, or another suitable switching element.

Section connection transmission gate 116a is configured to selectively connect variable inverters 112a to variable inverters 112b. Selectively connecting variable inverters 112a to variable inverters 112b facilitates adjustment of the number of stages. In some embodiments, section connection transmission gate 116a is configured to be controlled by an external circuit. In some embodiments, the external circuit controlling section connection transmission gate 116a is a same external circuit as that for controlling feedback transmission gate 114a. In some embodiments, the external circuit controlling section connection transmission gate 116a is a different external circuit from that for controlling feedback transmission gate 114a. In some embodiments, section connection transmission gate 116a has a same structure as feedback transmission gate 114a. In some embodiments, section connection transmission gate 116a has a different structure from feedback transmission gate 114a.

Second section 110b includes two variable inverters 112b. In some embodiments, second section 110b includes more or less than two variable inverters 112b. In some embodiments, second section 110b includes one variable inverter, four variable inverters, or six variable inverters. Each variable inverter 112b has a same structure. In some embodiments, at least one variable inverter 112b has a different structure from at least one other variable inverter 112b. In some embodiments, variable inverters 112b have a same structure as variable inverters 112a. In some embodiments, variable inverters 112b have a different structure from variable inverters 112a.

Second section 110b also includes feedback transmission gate 114b to selectively feedback the output of the second section to an input of the first section. In some embodiments, feedback transmission gate 114b is configured to be controlled by an external circuit. In some embodiments, feedback transmission gate 114b is controlled by a same external circuit as at least one of feedback transmission gate 114a or section connection transmission gate 116a. In some embodiments, feedback transmission gate 114b is controlled by a different external circuit from at least one of feedback transmission gate 114a or section connection transmission gate 116a. In a measuring arrangement where first section 110a is connected with second section 110b, e.g., section connection transmission gate 116a is activated; and second section 110b is disconnected from subsequent sections, e.g., section connection transmission gate 116b is de-activated; feedback transmission gate 114b is activated to connect the output of variable inverters 112b to the input of variable inverters 112a. In some embodiments, feedback transmission gate 114b has a same structure as at least one of feedback transmission gate 114a or section connection transmission gate 116a. In some embodiments, feedback transmission gate 114b has a different structure from at least one of feedback transmission gate 114a or section connection transmission gate 116a.

Section connection transmission gate 116b is configured to selectively connect variable inverters 112b to variable inverters in subsequent sections of flicker noise measurement circuit 100. Selectively connecting variable inverters 112b to variable inverters in subsequent sections facilitates adjustment of the number of stages. In some embodiments, section connection transmission gate 116b is configured to be controlled by an external circuit. In some embodiments, the external circuit controlling section connection transmission gate 116b is a same external circuit as that for controlling at least one of feedback transmission gate 114a, section connection transmission gate 116a or feedback transmission gate 114b. In some embodiments, the external circuit controlling section connection transmission gate 116b is a different external circuit from that for controlling at least one of feedback transmission gate 114a, section connection transmission gate 116a or feedback transmission gate 114b. In some embodiments, section connection transmission gate 116b has a same structure as at least one of feedback transmission gate 114a, section connection transmission gate 116a or feedback transmission gate 114b. In some embodiments, section connection transmission gate 116b has a different structure from at least one of feedback transmission gate 114a, section connection transmission gate 116a or feedback transmission gate 114b.

In some embodiments, each subsequent section of flicker noise measurement circuit 100 has a same structure as second section 110b. In some embodiments, at least one subsequent section of flicker noise measurement circuit 100 has a same number of stages as at least one of first section 110a or second section 110b. In some embodiments, at least one subsequent section of flicker noise measurement circuit 100 has a different number of stages from at least one of first section 110a or second section 110b. In some embodiments, at least one subsequent section of flicker noise measurement circuit 100 does not include at least one of a feedback transmission gate or a section connection transmission gate. For example, a final section, i.e., a section electrically farthest from first section 110a, is free of a feedback transmission gate and a section connection transmission gate.

A phase noise of flicker noise measurement circuit is measurable by a spectrum analyzer. In operation, flicker noise measurement circuit 100 is usable to adjust both a number of stages as well as a slope rise/fall ratio. The number of stages is adjusted by selectively activating and de-activating feedback transmission gates and section connection transmission gates of flicker noise measurement circuit 100. The slope rise/fall ratio is adjusted by varying a driving force applied to variable inverters, e.g., variable inverters 112a or variable inverters 112b, of flicker noise measurement circuit 100. Adjusting the number of stages and the slope rise/fall ratio helps to determine the accuracy of the measured phase noise. Adjusting the number of stages and the slope rise/fall ratio also produces a large number of possible results for the flicker noise. This pool of results is used to determine the flicker noise for the device. In some embodiments, the flicker noise is selected as the worst result, i.e., most flicker noise, from the pool of results. In some embodiments, the flicker noise is selected as the best result, i.e., least flicker noise, from the pool of results. In some embodiments, the flicker noise is determined based on an average, a median, a mode, a standard deviation calculation for the pool of results.

Figure 2:
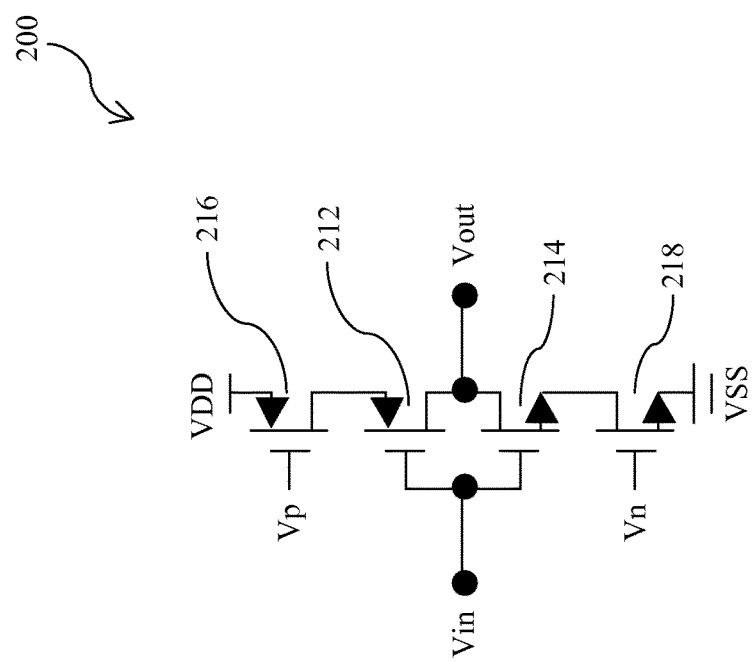
FIG. 2 is a schematic diagram of a variable inverter in accordance with some embodiments.

FIG. 2 is a schematic diagram of a variable inverter 200 in accordance with some embodiments. Variable inverter 200 includes a first p-type transistor 212, a first n-type transistor 214, a second p-type transistor 216 and a second n-type transistor 218. A source of first p-type transistor 212 is connected to a drain of second p-type transistor 216. A drain of first p-type transistor 212 is connected to a drain of first n-type transistor 214 and is configured to provide an output signal Vout. A gate of first p-type transistor 212 is connected to a gate of first n-type transistor 214 and is configured to receive an input signal Vin. A source of first n-type transistor 214 is connected to a drain of second n-type transistor 218. A source of second p-type transistor 216 is connected to a supply voltage VDD. A gate of second p-type transistor 216 is configured to receive a first biasing voltage Vp. A source of second n-type transistor 218 is connected to a reference voltage VSS. A gate of second n-type transistor 218 is configured to receive a second biasing voltage Vn.

In some embodiments, at least one of first p-type transistor 212, first n-type transistor 214, second p-type transistor 216 or second n-type transistor 218 is a metal oxide semiconductor field effect transistor (MOSFET), a fin field effect transistor (FinFET), a gate all around transistor, a bi-polar junction transistor (BJT), or another suitable transistor.

In some embodiments, variable inverters 112a (FIG. 1) or variable inverters 112b have the structure of variable inverter 200. In some embodiments, input signal Vin is received from a previous stage of a flicker noise measurement circuit, e.g., flicker noise measurement circuit 100. In some embodiments, input signal Vin is an input to the flicker noise measurement circuit. In some embodiments, output signal Vout is provided to a subsequent stage of the flicker noise measurement circuit. In some embodiments, output signal Vout is measured to determine the flicker noise of the device.

First biasing signal Vp is configured to adjust a driving strength of supply voltage VDD in variable inverter 200. In some embodiments, supply voltage VDD is an operating voltage of the device. In some embodiments, supply voltage VDD is different from the operating voltage of the device. In some embodiments, first biasing signal Vp is provided by an external control circuit. In some embodiments, the external control circuit for providing first biasing signal Vp is a same external control circuit as that for controlling at least one of feedback transmission gate 114a (FIG. 1), section connection transmission gate 116a, feedback transmission gate 114b, or section connection transmission gate 116b. In some embodiments, the external control circuit for providing first biasing signal Vp is a different external control circuit from that for controlling at least one of feedback transmission gate 114a (FIG. 1), section connection transmission gate 116a, feedback transmission gate 114b, or section connection transmission gate 116b.

Second biasing signal Vn is configured to adjust a driving strength of reference voltage VSS in variable inverter 200. In some embodiments, reference voltage VSS is a reference voltage of the device. In some embodiments, reference voltage VSS is different from the reference voltage of the device. In some embodiments, reference voltage VSS is ground. In some embodiments, reference voltage VSS is different from ground. In some embodiments, second biasing signal Vn is provided by an external control circuit. In some embodiments, the external control circuit for providing second biasing signal Vn is a same external control circuit as that for controlling at least one of feedback transmission gate 114a (FIG. 1), section connection transmission gate 116a, feedback transmission gate 114b, section connection transmission gate 116b or for providing first biasing signal Vp. In some embodiments, the external control circuit for providing second biasing signal Vn is a different external control circuit from that for controlling at least one of feedback transmission gate 114a (FIG. 1), section connection transmission gate 116a, feedback transmission gate 114b, section connection transmission gate 116b, or for providing first biasing signal Vp.

By adjusting the driving forces for supply voltage VDD and reference voltage VSS, different values for the slope rise/fall ratio, $\beta$, are obtained for a flicker noise measurement circuit, e.g., flicker noise measurement circuit 100 (FIG. 1). In some embodiments, a same first biasing signal Vp and second biasing signal Vn are provided to each variable inverter, e.g., variable inverters 112a or variable inverters 112b, of the flicker noise measurement circuit. In some embodiments, a different first biasing signal Vp or second biasing signal Vn is provided to at least one variable inverter of the flicker noise measurement circuit in comparison with another variable inverter of the flicker noise measurement circuit.

Figure 3:
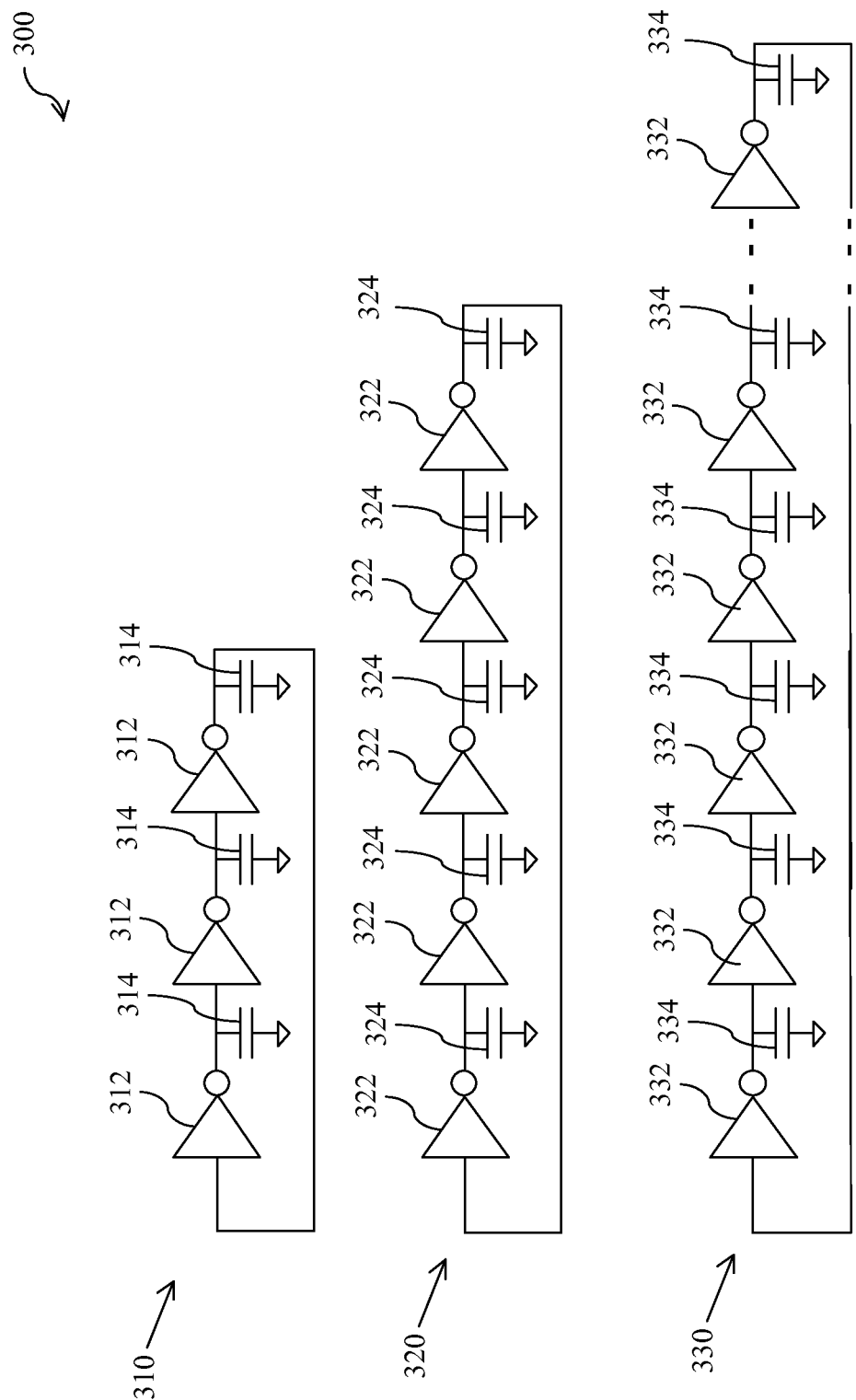
FIG. 3 is a schematic diagram of a flicker noise measurement circuit for measuring flicker noise in accordance with some embodiments.

FIG. 3 is a schematic diagram of a flicker noise measurement circuit 300 for measuring flicker noise in accordance with some embodiments. Flicker noise measurement circuit 300 includes a first sub-circuit 310, a second sub-circuit 320 and a third sub-circuit 330. Each sub-circuit 310, 320 and 330 independently is a ring oscillator. Sub-circuits 310, 320 and 330 are separated from each other, i.e., signals are not shared between the sub-circuits. First sub-circuit 310 includes three inverters 312 connected in series. Capacitors 314 are connected to an output of each inverter 312. An output of a last inverter in the series of inverters 312 is fed back to an input of the series of inverters of first sub-circuit 310. Second sub-circuit 320 includes five inverters 322 connected in series. Capacitors 324 are connected to an output of each inverter 322. An output of a last inverter in the series of inverters 322 is fed back to an input of the series of inverters of second sub-circuit 320. Third sub-circuit 330 includes 2X+1 inverters 332 connected in series, where X is an integer greater than or equal to 1. Capacitors 334 are connected to an output of each inverter 332. An output of a last inverter in the series of inverters 332 is fed back to an input of the series of inverters of second sub-circuit 330.

In comparison with flicker noise measurement circuit 100 (FIG. 1), flicker noise measurement circuit 300 includes a fixed number of stages. Each sub-circuit of flicker noise measurement circuit 300 includes a different number of stages. In some embodiments, flicker noise measurement circuit 300 includes more than three sub-circuits. As a number of sub-circuits increases, a number of results of the pool of results for flicker noise measurements increases. However, as a number of sub-circuits increases, an area of the device occupied by flicker noise measurement circuit 300 increases. In some embodiments, at least one of inverters 312, inverters 322 or inverters 332 are variable inverters, e.g., variable inverter 200 (FIG. 2). Including variable inverters in first sub-circuit 310, second sub-circuit 320, or third sub-circuit 330 provides an ability to adjust a slope rise/fall ratio, β, for each of the sub-circuits.

In operation, an output of each sub-circuit, e.g., first sub-circuit 310, second sub-circuit 320 and third sub-circuit 330, is measured to determine the pool of results for flicker noise. In some embodiments which include variable inverters, the slope rise/fall ratio, β, is also adjusted to increase the number of results in the pool of results. In some embodiments, the flicker noise is selected as the worst result, i.e., most flicker noise, from the pool of results. In some embodiments, the flicker noise is selected as the best result, i.e., least flicker noise, from the pool of results. In some embodiments, the flicker noise is determined based on an average, a median, a mode, a standard deviation calculation for the pool of results.

FIG. 4A is a schematic diagram of a flicker noise measurement circuit 400 for measuring flicker noise in accordance with some embodiments. Flicker noise measurement circuit 400 includes a first sub-circuit 410, a second sub-circuit 420 and a third sub-circuit 430. Each sub-circuit 410, 420 and 430 independently is a ring oscillator. Sub-circuits 410, 420 and 430 are separated from each other, i.e., signals are not shared between the sub-circuits. First sub-circuit 410 includes two amplifiers 412 connected in series. Each amplifier 412 includes an inverted input, a non-inverted input, an inverted output a non-inverted output. The inverted output of one amplifier 412 is connected to the non-inverted input of a subsequent amplifier 412. The non-inverted output of the one amplifier 412 is connected to the inverted input of the subsequent amplifier 412. The non-inverted output of a last amplifier in the series of amplifiers 412 is fed back to the inverted input of the series of amplifiers of first sub-circuit 410. The inverted output of a last amplifier in the series of amplifiers 412 is fed back to the non-inverted input of the series of amplifiers of first sub-circuit 410. Second sub-circuit 420 includes three amplifiers 422 connected in series. Each amplifier 422 includes an inverted input, a non-inverted input, an inverted output a non-inverted output. The inverted output of one amplifier 422 is connected to the non-inverted input of a subsequent amplifier 422. The non-inverted output of the one amplifier 422 is connected to the inverted input of the subsequent amplifier 422. The non-inverted output of a last amplifier in the series of amplifiers 422 is fed back to the inverted input of the series of amplifiers of first sub-circuit 420. The inverted output of a last amplifier in the series of amplifiers 422 is fed back to the non-inverted input of the series of amplifiers of first sub-circuit 420. Third sub-circuit 430 includes X amplifiers 432 connected in series, where X is an integer greater than or equal to 1. Each amplifier 432 includes an inverted input, a non-inverted input, an inverted output a non-inverted output. The inverted output of one amplifier 432 is connected to the non-inverted input of a subsequent amplifier 432. The non-inverted output of the one amplifier 432 is connected to the inverted input of the subsequent amplifier 432. The non-inverted output of a last amplifier in the series of amplifiers 432 is fed back to the inverted input of the series of amplifiers of first sub-circuit 430. The inverted output of a last amplifier in the series of amplifiers 432 is fed back to the non-inverted input of the series of amplifiers of first sub-circuit 430.

In comparison with flicker noise measurement circuit 100 (FIG. 1), flicker noise measurement circuit 400 includes a fixed number of stages. However, each amplifier, e.g., amplifiers 412, amplifiers 422 or amplifiers 432, of flicker noise measurement circuit 400 is considered as two stages. For example, a number of stages in sub-circuit 430 is 2X. Each sub-circuit of flicker noise measurement circuit 400 includes a different number of stages. In some embodiments, flicker noise measurement circuit 400 includes more than three sub-circuits. As a number of sub-circuits increases, a number of results for the pool of results for flicker noise measurements increases. However, as a number of sub-circuits increases, an area of the device occupied by flicker noise measurement circuit 300 increases.

In operation, an output of each sub-circuit, e.g., first sub-circuit 410, second sub-circuit 420 and third sub-circuit 430, is measured to determine the pool of results for flicker noise. In some embodiments, the flicker noise is selected as the worst result, i.e., most flicker noise, from the pool of results. In some embodiments, the flicker noise is selected as the best result, i.e., least flicker noise, from the pool of results. In some embodiments, the flicker noise is determined based on an average, a median, a mode, a standard deviation calculation for the pool of results.

Figure 4B:
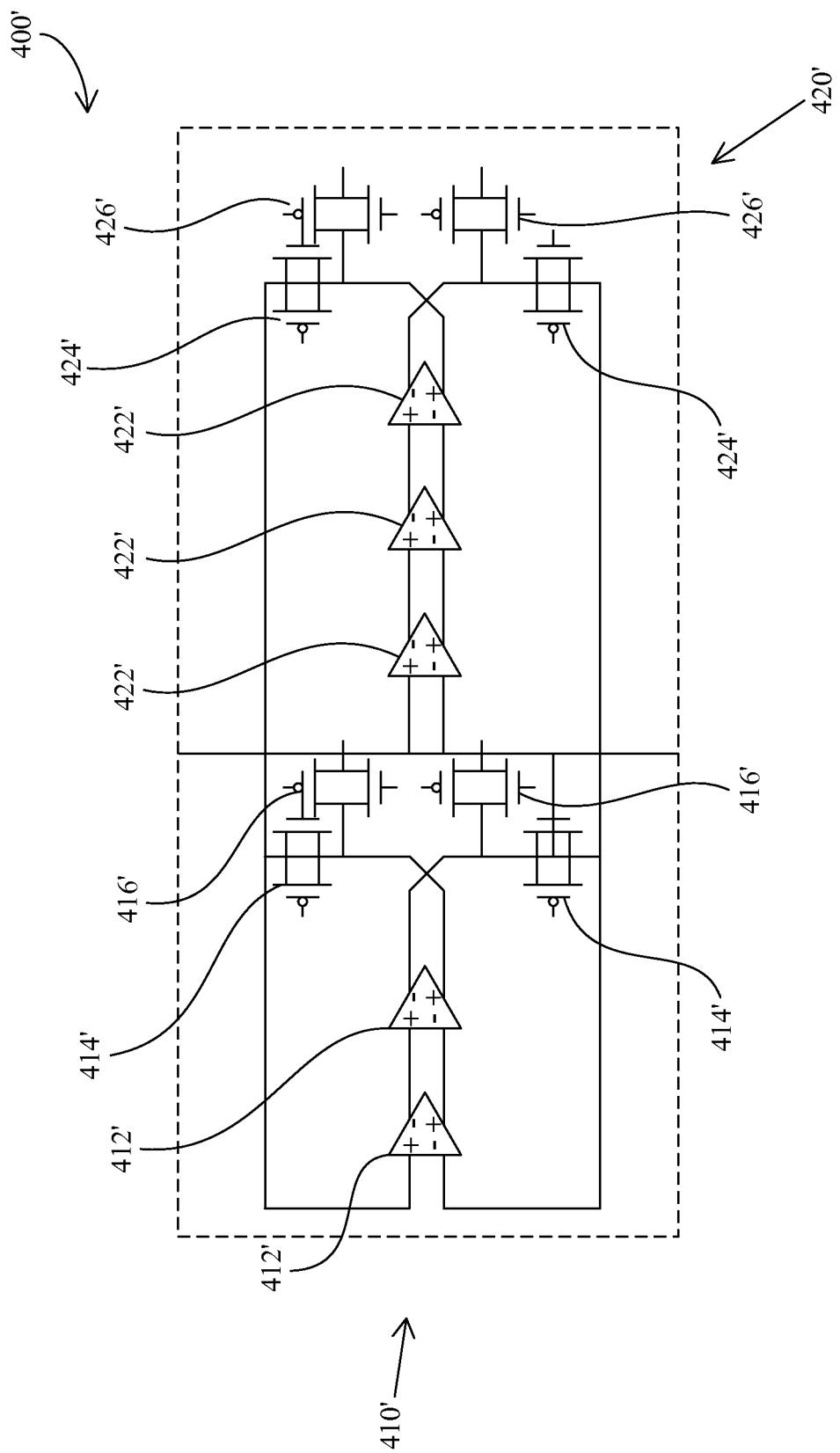
FIG. 4B is a schematic diagram of a flicker noise measurement circuit for measuring flicker noise in accordance with some embodiments.

FIG. 4B is a schematic diagram of a flicker noise measurement circuit 400' for measuring flicker noise in accordance with some embodiments. Flicker noise measurement circuit 400' is similar to flicker noise measurement circuit 100 (FIG. 1). In comparison with flicker noise measurement circuit 100, flicker noise measurement circuit 400' includes amplifiers 412' and amplifiers 414' in place of variable inverters. Feedback within a section 410' of flicker noise measurement circuit 400' is controlled using feedback transmission gates 414'. Connection between section 410' and a section 420' is controlled by section connection transmission gates 416'. Feedback within section 420' of flicker noise measurement circuit 400' is controlled using feedback transmission gates 424'. Connection between section 420' and a subsequent section is controlled by section connection transmission gates 426'.

Structure and control of transmission gates in flicker noise measurement circuit 400' is similar to the structure and control described above with respect to flicker noise measurement circuit 100 (FIG. 1). In comparison with flicker noise measurement circuit 100, flicker noise measurement circuit 400' includes two transmission gates for controlling feedback and section connection due to the inclusion of amplifiers in flicker noise measurement circuit 400' instead of variable inverters.

Figure 5:
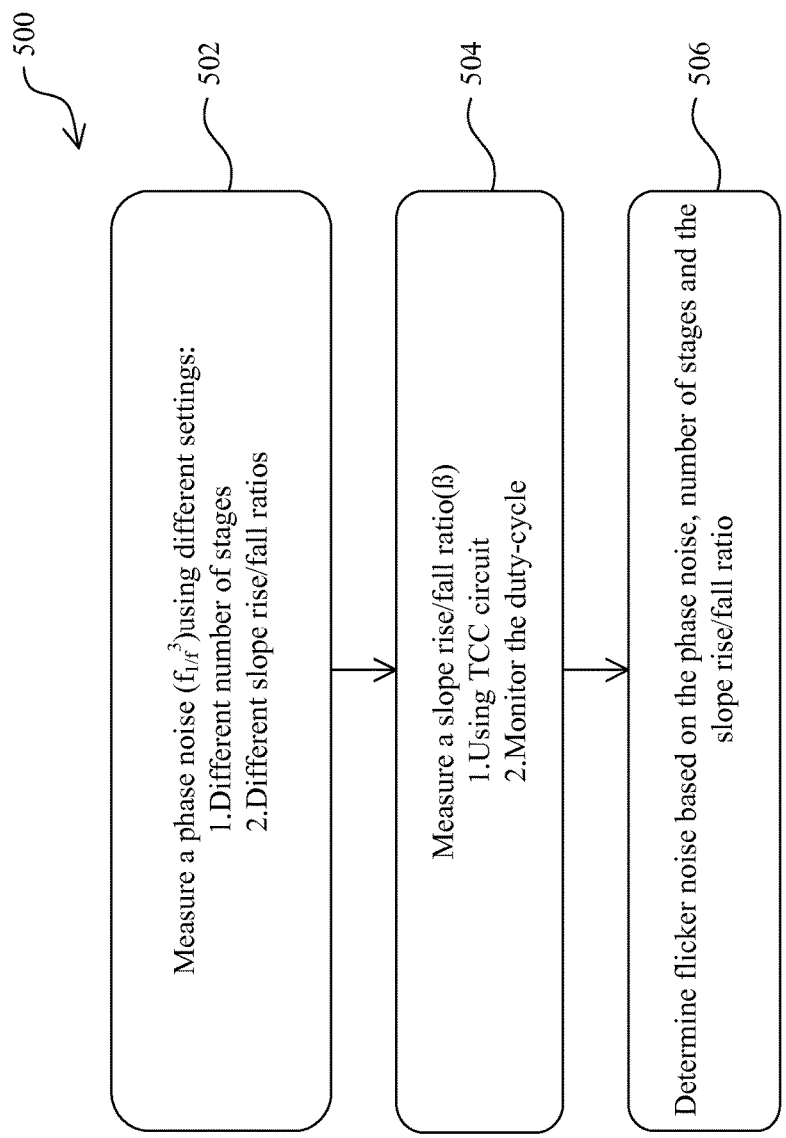
FIG. 5 is a flow chart of a method of measuring flicker noise in accordance with some embodiments.

FIG. 5 is a flow chart of a method 500 of measuring flicker noise in accordance with some embodiments. Method 500 begins with operation 502 in which a phase noise is measured using different settings. In some embodiments, the phase noise is measured using a spectrum analyzer. The spectrum analyzer measures an output of a flicker noise measurement circuit, e.g., flicker noise measurement circuit 100 (FIG. 1), 300 (FIG. 3), 400 (FIG. 4A) or 400' (FIG. 4B).

The phase noise is measured for different numbers of stages, N. In some embodiments, the number of stages is adjusted by controlling connections between different sections of the flicker noise measurement circuit, e.g., flicker noise measurement circuit 100 or 400'. In some embodiments, the number of stages is adjusted by measuring outputs from different sub-circuits having a different number of stages, e.g., flicker noise measurement circuit 300 or 400.

In some embodiments, the phase noise is measured using different slope rise/fall ratios, β. In some embodiments, the slope rise/fall ratio is adjusted by altering a driving voltage applied to a stage of the flicker noise measurement circuit.

Method 500 continues with operation 504 in which a slope rise/fall ratio is measured. In some embodiments, the slope rise/fall ratio is measured by monitoring a duty cycle of the flicker noise measurement circuit. In some embodiments, the duty cycle of the flicker noise measurement circuit is monitored using a time-to-current converter (TCC) circuit. In some embodiments, the TCC circuit is similar to the TCC circuit described in U.S. Pre-Grant Publication 2013/0049810, U.S. application Ser. No. 13/221,628; which is incorporated herein by reference. The TCC circuit is used to monitor a duty-cycle of the flicker noise measurement circuit. By determining a length of time for a signal to transition from a reference voltage, e.g., reference voltage VSS, to a supply voltage, e.g., supply voltage VDD, a slope rise value is able to be calculated. Similarly, determining a length of time for a signal to transition from the supply voltage to the reference voltage permits calculation of a slope fall value. Using the slope rise value and the slope fall value, the slope rise/fall ratio, β, is able to be calculated. In some embodiments, operation 504 is performed simultaneously with operation 502. In some embodiments, operation 504 is performed sequentially with operation 502.

In operation 506, a flicker noise is calculated based on the measured phase noise, measured slope rise/fall ratio and the number of stages used in the flicker noise measurement circuit. The flicker noise is calculated based on the phase noise, a number of stages in the flicker noise measurement circuit, and a ratio of a slope of a rise of the output waveform to a slope of the fall of the output waveform. In some embodiments, method 500 is repeated multiple times to generate a pool of flicker noise results. In some embodiments, a flicker noise is selected from the pool of flicker noise results, e.g., selecting a best flicker noise value, selecting a worst flicker noise value, or selecting a most common flicker noise value. In some embodiments, the flicker noise is calculated based on the pool of flicker noise results, e.g., by determining an average, by identifying a median value, or using a standard deviation calculation.

In some embodiments, operations 502, 504 and 506 are performed using a same device, e.g., a spectrum analyzer. In some embodiments, at least one of operation 502, 504 or 506 is performed using a different device from at least one other of operation 502, 504 or 506. In some embodiments, method 500 includes additional operations, such as storing flicker noise results in a look-up table for comparison with other manufactured devices, calibrating measurement equipment, or another suitable operation. In some embodiments, an order of operations in method 500 is modified, e.g., operation 504 is performed before operation 502.

One aspect of this description relates to a flicker noise measurement circuit. The flicker noise measurement circuit includes a first section. The first section includes a plurality of first stages connected in series. The first section further includes a first feedback switching element configured to selectively feedback an output of the plurality of first stages to an input of the plurality of first stages. The first section further includes a first section connection switching element. The flicker noise measurement circuit further includes a second section connected to the first section. The second section includes a plurality of second stages connected in series, wherein the first section connection switching element is configured to selectively connect the plurality of second stages to the plurality of first stages. The second section further includes a second feedback switching element configured to selectively feedback an output of the plurality of second stages to the input of the plurality of first stages.

Another aspect of this description relates to a flicker noise measurement circuit. The flicker noise measurement circuit includes a first sub-circuit comprising a plurality of first stages connected in series. The flicker noise measurement circuit further includes a second sub-circuit comprising a plurality of second stages connected in series, wherein a number of stages of the plurality of second stages is different from a number of stages of the plurality of first stages, and the second sub-circuit is separate from the first sub-circuit. The flicker noise measurement circuit further includes a third sub-circuit comprising a plurality of third stages connected in series, wherein a number of stages of the plurality of third stages is different from the number of stages of the plurality of second stages and the number of stages of the plurality of first stages, and the third sub-circuit is separate from the first sub-circuit and from the second sub-circuit.

Still another aspect of this description relates to a method of determining flicker noise. The method includes measuring a first phase noise using a first flicker noise measurement circuit, wherein the first flicker noise measurement circuit has a first number of stages and a first slope rise/fall ratio. The method further includes measuring a second phase noise using a second flicker noise measurement circuit, wherein the second flicker noise measurement circuit has a second number of stages and a second slope rise/fall ratio. The method further includes determining the first slope rise/fall ratio. The method further includes determining the second slope rise/fall ratio. The method further includes calculating a first flicker noise based on the measured first phase noise, the first number of stages and the determined first slope rise/fall ratio. The method further includes calculating a second flicker noise based on the measured second phase noise, the second number of stages and the determined second slope rise/fall ratio.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining flicker noise, the method comprising:
   measuring a first phase noise using a first flicker noise measurement circuit, wherein the first flicker noise measurement circuit has a first number of stages and a first slope rise/fall ratio;
   measuring a second phase noise using a second flicker noise measurement circuit, wherein the second flicker noise measurement circuit has a second number of stages and a second slope rise/fall ratio;

setting the second slope rise/fall ratio to be different from the first slope rise/fall ratio by applying a first driving force to the first flicker noise measurement circuit and a second driving force to the second flicker noise measurement circuit, wherein the second driving force is different from the first driving force;

determining the first slope rise/fall ratio;

determining the second slope rise/fall ratio;

calculating a first flicker noise based on the measured first phase noise, the first number of stages and the determined first slope rise/fall ratio;

calculating a second flicker noise based on the measured second phase noise, the second number of stages and the determined second slope rise/fall ratio; and selecting the flicker noise from a pool of flicker noise results including the first flicker noise and the second flicker noise.

2. The method of claim 1, further comprising determining an average flicker noise, a flicker noise median value, or a flicker noise standard deviation.

3. The method of claim 1, wherein measuring the first phase noise and the second phase noise further comprises using a spectrum analyzer.

4. The method of claim 1, wherein
determining the first slope rise/fall ratio comprises monitoring a duty cycle of the first flicker noise measurement circuit, and
determining the second slope rise/fall ratio comprises monitoring a duty cycle of the second flicker noise measurement circuit.

5. The method of claim 4, wherein each of monitoring the duty cycle of the first flicker noise measurement circuit and monitoring the duty cycle of the second flicker noise measurement circuit comprises using a time-to-current converter circuit.

6. The method of claim 4, wherein each of monitoring the duty cycle of the first flicker noise measurement circuit and monitoring the duty cycle of the second flicker noise measurement circuit comprises determining a length of time for a signal to transition between a reference voltage and a supply voltage.

7. The method of claim 1, wherein selecting the flicker noise from the pool of flicker noise results comprises selecting a best flicker noise value, selecting a worst flicker noise value, or selecting a most common flicker noise value.

8. The method of claim 1, wherein determining the first slope rise/fall ratio and determining the second slope rise/fall ratio are performed after measuring the first phase noise and measuring the second phase noise.

9. The method of claim 1, wherein
using the first flicker noise measurement circuit comprises adjusting a flicker noise measurement circuit to have the first number of stages,
using the second flicker noise measurement circuit comprises adjusting the flicker noise measurement circuit to have the second number of stages,
applying the first driving force to the first flicker noise measurement circuit comprises applying the first driving force to the flicker noise measurement circuit, and applying the second driving force to the second flicker noise measurement circuit comprises applying the second driving force to the flicker noise measurement circuit.

10. The method of claim 9, wherein each of adjusting the flicker noise measurement circuit to have the first number of stages and adjusting the flicker noise measurement circuit to have the second number of stages comprises controlling connections between different sections of the flicker noise measurement circuit.

11. The method of claim 10, wherein controlling connections between different sections of the flicker noise measurement circuit comprises selectively connecting variable inverters in a first section of the flicker noise measurement circuit to variable inverters in one or more subsequent sections of the flicker noise measurement circuit.

12. The method of claim 10, wherein controlling connections between different sections of the flicker noise measurement circuit comprises selectively connecting amplifiers in a first section of the flicker noise measurement circuit to amplifiers in one or more subsequent sections of the flicker noise measurement circuit.

13. The method of claim 10, wherein controlling connections between different sections of the flicker noise measurement circuit comprises either
activating a feedback transmission gate and de-activating a section connection transmission gate, or
de-activating a feedback transmission gate and activating a section connection transmission gate.

14. The method of claim 9, wherein each of determining the first slope rise/fall ratio and determining the second slope rise/fall ratio comprises monitoring a duty cycle of the flicker noise measurement circuit.

15. The method of claim 14, wherein monitoring the duty cycle of the flicker noise measurement circuit comprises using a time-to-current converter circuit to determine a length of time for a signal to transition between a reference voltage and a supply voltage.

16. The method of claim 1, wherein
using the first flicker noise measurement circuit comprises using a first sub-circuit of a flicker noise measurement circuit,
using the second flicker noise measurement circuit comprises using a second sub-circuit of the flicker noise measurement circuit,
applying the first driving force to the first flicker noise measurement circuit comprises applying the first driving force to the first sub-circuit of the flicker noise measurement circuit, and applying the second driving force to the second flicker noise measurement circuit comprises applying the second driving force to the second sub-circuit of the flicker noise measurement circuit.

17. The method of claim 16, wherein
using the first sub-circuit of the flicker noise measurement circuit comprises using a first series of variable inverters having a first number of variable inverters, and
using the second sub-circuit of the flicker noise measurement circuit comprises using a second series of variable inverters having a second number of variable inverters different from the first number of variable inverters.

18. The method of claim 16, wherein
using the first sub-circuit of the flicker noise measurement circuit comprises using a first series of amplifiers having a first number of amplifiers, and
using the second sub-circuit of the flicker noise measurement circuit comprises using a second series of amplifiers having a second number of amplifiers different from the first number of amplifiers.

19. The method of claim 16, wherein
determining the first slope rise/fall ratio comprises monitoring a duty cycle of the first sub-circuit of the flicker noise measurement circuit using a time-to-current converter circuit, and
determining the second slope rise/fall ratio comprises monitoring a duty cycle of the second sub-circuit of the flicker noise measurement circuit using the time-to-current converter circuit.

20. The method of claim 19, wherein using the time-to-current converter circuit comprises determining a length of time for a signal to transition between a reference voltage and a supply voltage.

* * * * *